United States Patent
Kim et al.

(10) Patent No.: US 11,397,382 B2
(45) Date of Patent: Jul. 26, 2022

(54) METHOD FOR SELECTIVE DELAMINATION AND TRANSFER OF THIN FILM USING LIQUID PLATFORM

(71) Applicant: Korea Advanced Institute of Science and Technology, Daejeon (KR)

(72) Inventors: Taek-Soo Kim, Daejeon (KR); Sumin Kang, Daejeon (KR)

(73) Assignee: Korea Advanced Institute of Science and Technology, Daejeon (KR)

(*) Notice: Subject to any disclaimer, the term of this patent is extended or adjusted under 35 U.S.C. 154(b) by 20 days.

(21) Appl. No.: 16/736,983

(22) Filed: Jan. 8, 2020

(65) Prior Publication Data
US 2020/0387073 A1 Dec. 10, 2020

(30) Foreign Application Priority Data

Jun. 7, 2019 (KR) .................. 10-2019-0067201
Nov. 8, 2019 (KR) .................. 10-2019-0142449

(51) Int. Cl.
*G03F 7/20* (2006.01)
*H01L 29/786* (2006.01)
(Continued)

(52) U.S. Cl.
CPC .......... *G03F 7/2043* (2013.01); *B32B 37/025* (2013.01); *B44C 1/175* (2013.01);
(Continued)

(58) Field of Classification Search
CPC ........ B01D 2319/04; B01D 2321/2033; B01D 63/16; B01D 65/08; H01L 29/78603;
(Continued)

(56) References Cited

U.S. PATENT DOCUMENTS

| 4,337,289 A * | 6/1982 | Reed .................... C09D 11/101 428/199 |
| 4,762,766 A * | 8/1988 | Melbye .................. G03F 7/095 430/257 |
| 7,547,372 B1 * | 6/2009 | Sloan ...................... B44C 1/175 156/212 |

(Continued)

FOREIGN PATENT DOCUMENTS

KR 10-1508738 4/2015

OTHER PUBLICATIONS

English translation of KR1020190033969.*
Patent Family of U.S. Appl. No. 16/736,983.*
English translation of KR101508738B.*

*Primary Examiner* — Sonya M Sengupta
(74) *Attorney, Agent, or Firm* — Verrill Dana, LLP

(57) ABSTRACT

Provided is a selective transfer method including depositing a thin film on a substrate; patterning the thin film using a laser or a tool to acquire a thin film of a target pattern; masking the thin film of the target pattern; selectively controlling a surface wettability through surface treatment of the masked thin film; delaminating the thin film of the target pattern by dipping a surface of the thin film with a wettability changed in response to a completion of the selective surface treatment into a liquid material and by applying a crack opening force capable of delaminating an interface between the thin film and the substrate; and immersing a target substrate into the liquid material when the thin film of the target pattern is floating in the liquid material and then scoop-up transferring the floating thin film of the target pattern.

13 Claims, 12 Drawing Sheets

(51) Int. Cl.
*B32B 37/00* (2006.01)
*B44C 1/175* (2006.01)
*C10G 2/00* (2006.01)
*C10G 31/10* (2006.01)
*B01D 63/16* (2006.01)
*C10G 31/09* (2006.01)
*B01D 65/08* (2006.01)

(52) U.S. Cl.
CPC .......... *H01L 29/78603* (2013.01); *C10G 2/32* (2013.01); *C10G 2300/70* (2013.01); *G03F 7/2002* (2013.01); *G03F 7/70025* (2013.01)

(58) Field of Classification Search
CPC ................. G03F 7/2002; G03F 7/2043; G03F 7/70025; B32B 37/025; C10G 2300/1022; C10G 2300/70; C10G 2/32; C10G 31/09; C10G 31/10; B44C 1/175

USPC ......................................... 156/236, 237, 703
See application file for complete search history.

(56) References Cited

U.S. PATENT DOCUMENTS

| | | | |
|---|---|---|---|
| 2010/0032409 A1* | 2/2010 | Hong ................. | H01L 29/1606 216/41 |
| 2010/0035186 A1* | 2/2010 | Hong ....................... | H01B 1/24 430/311 |
| 2012/0321862 A1* | 12/2012 | Ikeda ..................... | B44C 1/175 524/588 |
| 2013/0288182 A1* | 10/2013 | Branton ................ | G03F 7/2059 204/192.12 |
| 2016/0279898 A1* | 9/2016 | Senzaki .................... | B32B 5/32 |
| 2018/0358144 A1* | 12/2018 | Ahn ........................ | B32B 38/10 |
| 2020/0387073 A1* | 12/2020 | Kim ....................... | G03F 7/2043 |

* cited by examiner

METHOD FOR SELECTIVE DELAMINATION AND TRANSFER OF THIN FILM USING LIQUID PLATFORM

This application claims the priority benefit of Korean Patent Applications No. 10-2019-0067201, filed on Jun. 7, 2019 and No. 10-2019-0142449, filed on Nov. 8, 2019, in the Korean Intellectual Property Office, the disclosure of which is incorporated herein by reference.

BACKGROUND

1. Field of the Invention

The following description of example embodiments relates to a selective delamination and transfer method, and more particularly, to a method of selectively delaminating and transferring a thin film of a desired pattern or a thin film of a desired region using a liquid platform.

2. Description of the Related Art

Currently, research on using a thin film and a two-dimensional material having mechanically, electrically, and optically excellent performance for, for example, wearable, flexible, and stretchable electronic devices, semiconductor devices, and wireless communication devices, is conducted. To develop and commercialize such application products, there is a need to develop a technique for manufacturing a deposited thin film in a desired pattern and selectively transferring the patterned thin film to a target substrate. For example, in the case of a next generation electronic device, such as a wearable sensor requiring a mechanical deformability, a nanofilm or a two-dimensional material needs to be integrated to a flexible polymer substrate with a relatively thin thickness. Here, since a polymer material has a low thermal stability, a vapor deposition method, such as a physical vapor deposition (PVD) method and a chemical vapor deposition (CVD) method, may not be readily applied. Accordingly, a process of depositing a thin film on a substrate having a relatively high thermal stability and a small surface roughness, such as a silicon wafer, and transferring the deposited thin film to a flexible substrate is required. At the same time, a pattern having geometrical elasticity, for example, a serpentine shape, needs to be formed since the flexible polymer substrate is deformable and an electrode material of, for example, a highly conductive metal has a significantly low elasticity. Accordingly, a process of transferring a patterned thin film is required. Also, a process of forming and integrating a specific pattern on a thin film is very important even to manufacture a thin film transistor (TFT) and an inductor used for a display, a wireless communication apparatus, and the like.

In an actual device manufacture, photolithography is widely used for patterning of a thin film. This method may acquire a pattern by coating a photoresist on an electrode, by removing the photoresist to be in a specific pattern through partial masking and ultraviolet (UV) light emission, and by selectively etching the electrode present in a portion from which the photoresist is removed. However, in the photolithography method, a patternable resolution is limited to 100 nanometers (nm) or more due to an optical diffraction phenomenon and a relatively large cost is required due to the complexity of a process and equipment. Also, the photolithography method may have a chemical waste occurrence issue caused by the use of etchant and a chemical damage issue unintendedly caused in a thin film. Further, it is difficult to apply a patterning process on a curved surface. As a technique for outperforming the above limitations, research on a patterning method using an electronic beam (E-beam), an ion beam, etc., has been conducted. However, still expensive equipment is required, which makes it difficult for general researchers to readily employ the technique.

Accordingly, research on a thin film patterning method capable of replacing the photolithography method is conducted. As a representative example, there is a soft lithography method. The soft lithography method may manufacture a thin film of a desired pattern using an elastomeric stamp or mold. Here, polydimethylsiloxane (PDMS) is most widely used as a stamp material. A pattern of a thin film is formed by transferring the thin film in a premanufactured pattern or along a predesigned surface pattern of PDMS stamp. Likewise, a method of transferring a mechanically patterned thin film using an adhesive strength may include, for example, a nano-imprinting method and a currently developed chemical lift-off method. Such techniques may be suitable for a biotechnique since it is possible to perform a process at a low cost compared to an existing photolithography process and the use of etchant and light exposure are not required. Also, the techniques may apply to the flexible polymer substrate and may also apply to the curved surface.

However, the soft lithography method may have the following limitations. First, due to the relatively high flexibility and deformability of an elastomeric stamp, unexpected deformation, for example lateral collapse and sagging of the patterned stamp, may occur and it may be difficult to achieve a relatively high resolution. Accordingly, it may be difficult to accurately embody a detailed pattern. Second, a contact scheme may cause an issue in other processes followed by a lithographic process due to a contamination material and a microparticle, etc., on the surface. Finally, a different type of a stamp is required for each pattern to form various patterns. In many cases, the soft lithography method requires a preprocessing process of photolithography to manufacture a pattern of a master mold. In addition, to improve a thin film patterning technique, various patterning techniques are being developed using, for example, inkjet printing, three-dimensional (3D) printing, etc., described in Korean Registration Patent No. 10-1508738. However, they are still at a technically low stage to be commercially available due to limitations, for example, a process resolution, application of various thin film materials, and a thickness minimization.

SUMMARY

Example embodiments provide a method of selectively delaminating and transferring a thin film using a liquid platform, and more particularly, technology for selectively delaminating and then transferring a thin film of a desired pattern or a thin film of a desired region using a liquid platform.

Example embodiments also provide a method of delaminating an interface between a substrate and a thin film using a surface tension of a liquid material and a method of easily transferring a thin film of a desired pattern or a desired region by inducing a selective modulation of surface wettability of a thin film material through surface treatment and accordingly provide a selective delamination method that is easily applicable to biotechnology, low cost, contact-free, and eco-friendly since an etching process and a direct light exposure to a substrate are not required.

According to an aspect of example embodiment, there is provided a selective transfer method including depositing a thin film on a substrate; patterning the thin film using a laser or a tool to acquire a thin film of a target pattern; masking the thin film of the target pattern; selectively controlling a surface wettability through surface treatment of the masked thin film; delaminating the thin film of the target pattern by dipping a surface of the thin film with a wettability changed in response to a completion of the selective surface treatment into a liquid material and by applying a crack opening force capable of delaminating an interface between the thin film and the substrate; and immersing a target substrate into the liquid material when the thin film of the target pattern is floating in the liquid material and then scoop-up transferring the floating thin film of the target pattern.

The masking may include masking the thin film of the target pattern using a material capable of preventing a surface treatment effect.

The selectively controlling of the surface wettability may include selectively controlling the surface wettability of the thin film by allowing the thin film of the target pattern of which masking is completed in response to surface treatment of a masked sample and not exposed to the surface treatment to maintain an original hydrophobic characteristic and by allowing the thin film of a region excluding a shape of the target pattern exposed to the surface treatment to have a hydrophilic characteristic.

The delaminating of the thin film of the target pattern may include proceeding with delamination in response to applying of a sufficient crack opening force capable of delaminating the interface between the thin film of the target pattern and the substrate by the liquid material in the case of the thin film of the target pattern having a hydrophobic characteristic, and not proceeding with delamination in response to a change in a formation angle of a meniscus line between the liquid material and the surface of the thin film and a decrease in a crack opening force in the case of the thin film of a region excluding a shape of the target pattern having a hydrophilic characteristic.

The scoop-up transferring of the floating thin film of the target pattern may include performing a protection and a transfer using a sacrificial layer of poly-methyl methacrylate (PMMA) based on an instability of a single layer to be floating in the water without a crack in the case of a two-dimensional material with a desired thickness or less, and removing the sacrificial layer after performing a transfer process.

The selective transfer method may further include acquiring a two-dimensional (2D) heterostructure in which special patterns in various shapes are stacked by iteratively performing a selective transfer process.

The delaminating of the thin film of the target pattern may include iteratively performing a delamination process on a plurality of thin films to be floating on the surface of the water; and assembling the plurality of floating thin films on the surface of the water, and the scoop-up transferring may include scoop-up transferring the plurality of thin films that floats and then is integrated by immersing the target substrate into the liquid material and then lifting up the target substrate.

According to an aspect of example embodiment, there is provided a selective transfer method including depositing a thin film on a substrate; patterning the thin film using a laser or a tool to acquire a thin film of a target pattern; masking a thin film of a region excluding a shape of the target pattern; selectively controlling a surface wettability through surface treatment of the masked thin film; delaminating the thin film of the region excluding the shape of the target pattern by dipping a surface of the thin film with a wettability changed in response to a completion of the selective surface treatment into a liquid material and by applying a crack opening force capable of delaminating an interface between the thin film and the substrate; and transferring the thin film of the target pattern remaining on the substrate using a difference in an adhesive strength.

The masking may include masking the thin film of the region excluding the shape of the target pattern using a material capable of preventing a surface treatment effect.

The selectively controlling of the surface wettability may include selectively controlling the surface wettability of the thin film by allowing the thin film of the region excluding the shape of the target pattern of which masking is completed in response to surface treatment of a masked sample and not exposed to the surface treatment to maintain an original hydrophobic characteristic and by allowing the thin film of the target pattern exposed to the surface treatment to have a hydrophilic characteristic.

The delaminating of the thin film of the region excluding the shape of the target pattern may include proceeding with delamination in response to applying of a sufficient crack opening force capable of delaminating the interface between the thin film of the region excluding the shape of the target pattern and the substrate by the liquid material in the case of the thin film of the region excluding the shape of the target pattern having a hydrophobic characteristic, and not proceeding with delamination in response to a change in a formation angle of a meniscus line between the liquid material and the surface of the thin film and a decrease in a crack opening force in the case of the thin film of the target pattern having a hydrophilic characteristic.

The transferring of the thin film of the target pattern may include increasing an adhesive strength between the thin film of the target pattern and a target substrate by using a van der Waals force or applying adhesives between the thin film of the target pattern and the target substrate, and transferring the thin film of the target pattern to the target substrate.

The selective transfer method may further include acquiring a 2D heterostructure in which special patterns in various shapes are stacked by iteratively performing a selective transfer process.

According to an aspect of at least one example embodiment, there is provided a thin film to be selectively transferred to a target substrate, the thin film including a thin film of a target pattern that is delaminated by patterning a thin film deposited on a substrate using a laser or a tool to acquire the thin film of the target pattern, by masking the thin film of the target pattern, by selectively controlling a surface wettability through surface treatment of the masked thin film, by dipping a surface of the thin film with a wettability changed in response to a completion of the selective surface treatment into a liquid material, and by applying a crack opening force capable of delaminating an interface between the thin film and the substrate; and the target substrate configured to scoop-up transfer the floating thin film of the target pattern by immersing the target substrate into the liquid material and then lifting up the target substrate when the thin film of the target pattern is floating in the liquid material.

According to an aspect of at least one example embodiment, there is provided a thin film to be selectively transferred to a target substrate, the thin film including a thin film of a target pattern that remains on a substrate by patterning a thin film deposited on a substrate using a laser or a tool to acquire the thin film of the target pattern, by masking a thin film of a region excluding a shape of the target pattern, by selectively controlling a surface wettability through surface treatment of the masked thin film, and by delaminating the thin film of the region excluding the shape of the target pattern by dipping a surface of the thin film with a wettability changed in response to a completion of the selective surface treatment into a liquid material and by applying a crack opening force capable of delaminating an interface between the thin film and the substrate; and the target substrate configured to transfer the thin film of the target pattern remaining on the substrate using a difference in an adhesive strength.

According to some example embodiment, there may be provided a method of delaminating an interface between a substrate and a thin film using a surface tension of a liquid material and a method of easily transferring a thin film of a desired pattern or a desired region by inducing a selective change in a wettability of a thin film material through surface treatment. Through this, it is possible to achieve a patterning process having a resolution beyond limitations found in existing processes. For example, a pattern size or a linear width may be widely controllable ranging from a centimeter scale to a nanometer scale.

Also, according to some example embodiments, there may be provided a selective transfer method that is easily applicable to biotechnology and eco-friendly since an etching process is not required and light is not directly exposed to a substrate. The use of etchant may cause chemical damage to a thin film and a substrate and may also cause a chemical waste treatment issue and accordingly, may be avoided.

Also, according to some example embodiments, patterning and transfer may be performed using only a liquid material, generally, for example, water, without using etchant. Therefore, it is possible to provide technology very suitable for the current trend, avoiding from chemical damage and environmental contamination issues.

According to some example embodiments, there may be provided a contact free thin film pattern formation method that may perform a highly efficient process at a low cost. In the existing photolithography and soft lithography methods for forming a pattern of a thin film, the photolithography method uses a non-contact type, however, requires a high cost and high technical equipment and clean room environment. The soft lithography method may perform a relatively low cost and high throughput process, however, may cause a postprocessing issue due to a contamination material and micro particles on the surface since a contact-type process is used. The present disclosure may be employed as an alternative to outperform the aforementioned issues and may readily perform a next-generation electronic product manufacture even in a small scale laboratory.

Further areas of applicability will become apparent from the description provided herein. The description and specific examples in this summary are intended for purposes of illustration only and are not intended to limit the scope of the present disclosure.

BRIEF DESCRIPTION OF THE DRAWINGS

These and/or other aspects, features, and advantages of the invention will become apparent and more readily appreciated from the following description of embodiments, taken in conjunction with the accompanying drawings of which.

DETAILED DESCRIPTION

Figure 1:
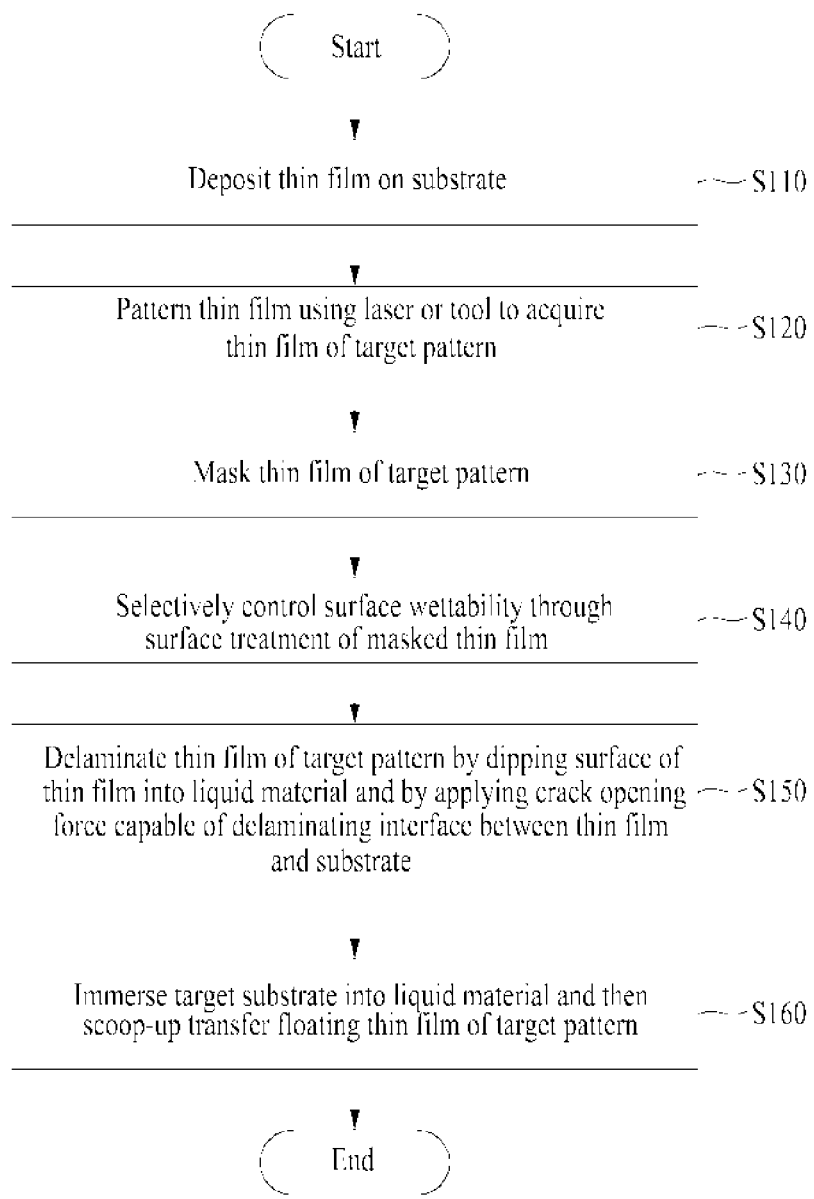
FIG. 1 is a flowchart illustrating a method of selectively delaminating and transferring a thin film using a liquid platform according to an example embodiment.

One or more example embodiments will be described in detail with reference to the accompanying drawings. Example embodiments, however, may be embodied in various different forms, and should not be construed as being limited to only the illustrated embodiments. Rather, the illustrated embodiments are provided as examples so that this disclosure will be thorough and complete, and will fully convey the concepts of this disclosure to those skilled in the art. Accordingly, known processes, elements, and techniques, may not be described with respect to some example embodiments.

When a component is described to be on another component, the component may be directly formed on the other component or a third component may be provided between the components. Also, in the drawings, thicknesses of components may be exaggerated to effectively describe technical content. Unless otherwise noted, like reference numerals refer to like components throughout the attached drawings and written description, and thus descriptions will not be repeated.

The example embodiments described herein will be described with the accompanying drawings. In the drawings, thicknesses of layers, regions, etc., may be exaggerated for effective description of the technical content. Accordingly, regions illustrated in the drawings may have general attributes and shapes of the regions are merely provided as examples and not construed to limit the scope of the disclosure. Terms "first", "second", "third", etc., are used to describe various components and the components should not be limited by the terms. The terms are simply used to distinguish one component from another component. The examples described herein include their complimentary example embodiments.

The example embodiments and the terms used herein are not construed to limit the disclosure to specific example embodiments and may be understood to include various modifications, equivalents, and/or substitutions. As used herein, the singular forms "a," "an," and "the," are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups, thereof.

Example embodiments relate to a method of selectively delaminating and then transferring a thin film of a desired pattern or a thin film of a desired region using a liquid platform, and more particularly, may provide a method of delaminating a thin film from a substrate using a surface tension of a liquid material and a method of inducing a selective change in a wettability through surface treatment and allowing only a thin film of a desired pattern to be floating on the surface of a liquid material and transferring the thin film to a target substrate or allowing only the thin film of the desired pattern to remain on the substrate and then transferring the same to the target substrate.

A thin film delamination method according to example embodiments may provide a new process completely different from a paradigm of an existing method and may achieve a relatively high resolution, an eco-friendly process, availability of various thin film materials, a thickness minimization, and a reduction in a process time and cost compared to existing processes. Accordingly, the thin film delamination method may apply to a thin film patterning and transfer process for developing and commercializing a next generation electronic device. For example, the thin film delamination method may apply to a thin film patterning process, a thin film transfer process, and a micro/nano technology, and may apply to a wearable sensor, a display and a semiconductor device, a micro light emitting device (LED), a biomedical device, a radio frequency (RF) wireless communication device, and the like.

The example embodiments may outperform the following technical issues.

Initially, a resolution issue that is found as a limitation in existing photolithography, soft lithography, inkjet printing process, and the like may be solved. By improving the technical skillfulness of the example embodiments, a thin film patterning and sophisticated transfer process of various scales ranging from a nanometer scale resolution to a large scale (mm~cm) resolution may be performed. By avoiding the use of etchant during a process and the direct light exposure to a target substrate, the process may be eco-friendly performed and may apply to the development of a bio application field.

Also, it is possible to simplify a process by selectively delaminating an interface between a substrate and a thin film deposited on the substrate using a surface tension of a liquid material without using an additional external force or adhesives and to transfer various thin film materials and extremely thin films. In the case of performing a selectively delamination using the surface tension of the liquid material, it is possible to control a surface wettability of the patterned thin film. Alternatively, it is possible to prevent an occurrence of a crack by allowing a shape of a crack to be different.

Even in an existing silicon wafer substrate, a flexible substrate, a curved substrate, etc., a process capable of transferring a patterned thin film is developed. Also, it is possible to secure a new functionality that may not be acquired in a single thin film structure readily configured using a two-dimensional (2D) heterostructure including different layers and a special pattern of thin films. Developed technology of the present disclosure may be widely used for commercialization of a next generation electronic device, for example, a wearable sensor, a flexible display and semiconductor device, a medical device, a radio frequency identification (RFID) based wireless communication device, and the like.

Hereinafter, a method of patterning and selectively transferring a thin film using a liquid material is described. Here, two approaches may be used to transfer a patterned thin film to a target substrate.

Figure 2:
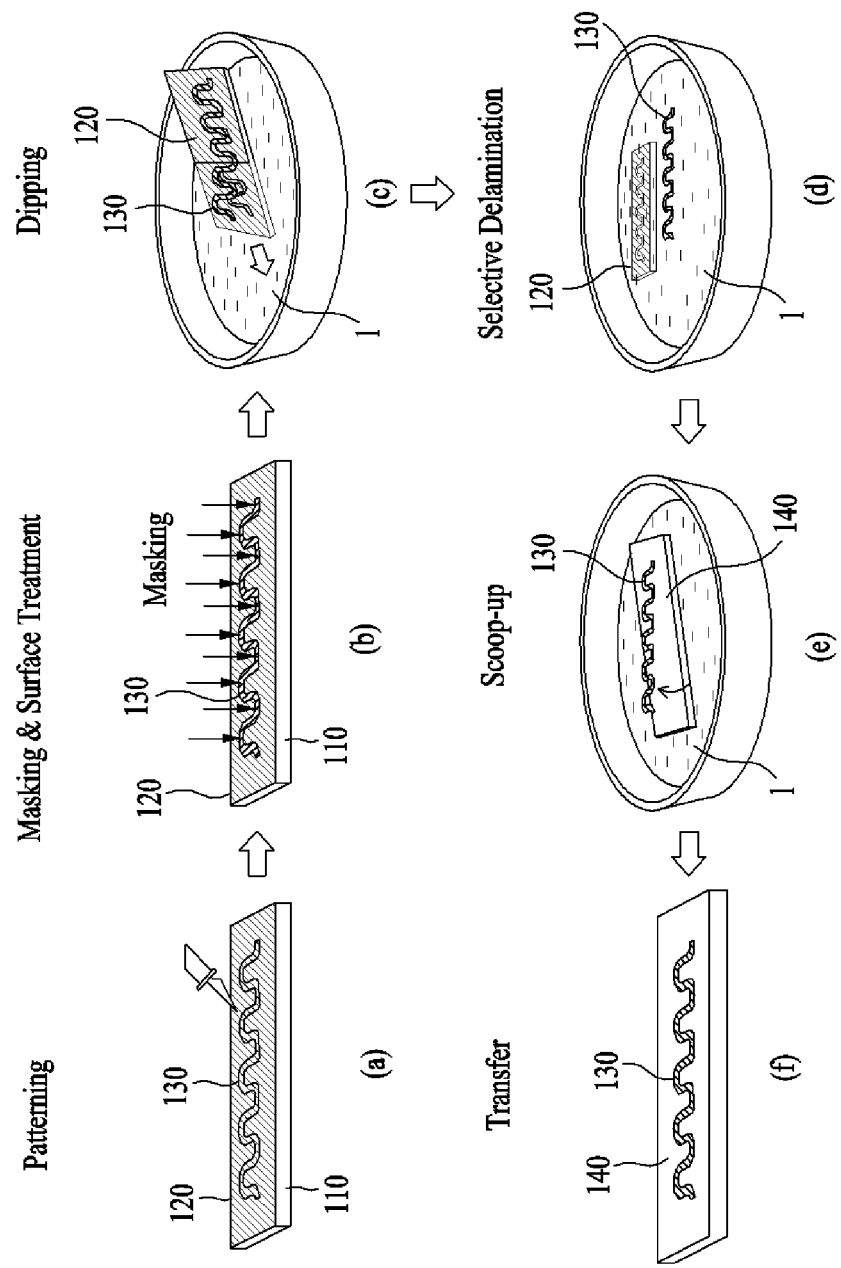
FIG. 2 illustrates an example of describing a method of selectively delaminating and transferring a thin film using a liquid platform according to an example embodiment.

FIG. 1 is a flowchart illustrating a method of selectively delaminating and transferring a thin film using a liquid platform according to an example embodiment, and FIG. 2 illustrates an example of describing a method of selectively delaminating and transferring a thin film using a liquid platform according to an example embodiment.

Referring to FIG. 1, the method of selectively delaminating and transferring a thin film using a liquid platform may include operation S110 of depositing a thin film on a substrate; operation S120 of patterning the thin film using a laser or a tool to acquire a thin film of a target pattern; operation S130 of masking the thin film of the target pattern; operation S140 of selectively controlling a surface wettability through surface treatment of the masked thin film; operation S150 of delaminating the thin film of the target pattern by dipping a surface of the thin film with a wettability changed in response to a completion of the selective surface treatment into a liquid material and by applying a crack opening force capable of delaminating an interface between the thin film and the substrate; and operation S160 of immersing a target substrate into the liquid material when the thin film of the target pattern is floating in the liquid material and then scoop-up transferring the floating thin film of the target pattern.

Hereinafter, each operation of the method of selectively delaminating and transferring a thin film using a liquid platform according to example embodiments will be further described with reference to FIGS. 1 and 2. Also, the method of selectively delaminating and transferring a thin film using a liquid platform may be performed by a system for selectively delaminating and transferring a thin film using a liquid platform, which is configured in a computer apparatus, etc. Also, at least one operation may be performed by a user.

In operation S110, a thin film 120 may be deposited on a substrate 110. For example, the thin film 120 may be deposited on the substrate 110 using an existing film deposition method, such as a chemical vapor deposition (CVD) or a physical vapor deposition (PVD). Here, a gold (Au) film and the thin film 120 may be deposited on a silicon wafer or a thermal oxide silicon wafer. However, in general, a quartz wafer, a GaAs wafer, a sapphire wafer, and glass having a relatively high thermal stability and low surface roughness may be used as a material of the substrate 110. Here, various materials including gold, a metal such as copper and nickel, polymer, ceramic, a complex material film, and a two-dimensional material such as graphene may be used as a material of the thin film 120.

Referring to (a) of FIG. 2, in operation S120, patterning may be performed on the thin film 120 using a laser and a tool to acquire a thin film 130 of a target pattern. For example, to acquire the thin film 130 of a desired pattern, a cutting plotter, a laser, a femtosecond laser for a precise process, a computerized numerically controlled (CNC) machining tool, and the like may be used. Here, the target pattern may be a character, and may be any pattern, for example, a serpentine pattern for an electrode, a pattern for a thin film inductor, and a pattern for a thin film transistor (TFT).

Referring to (b) of FIG. 2, in operation S130, masking may be performed on the thin film 130 of the target pattern. Here, the thin film 130 of the target pattern may be masked using a material capable of preventing a surface treatment effect as a masking material. For example, a polyimide (PI) film and photoresist may be used.

In operation S140, once masking is completed, a surface wettability may be selectively controlled through surface treatment of the thin film 120, 130. That is, the surface wettability may be selectively controlled through surface treatment at a point in time at which masking is completed. A region exposed for surface treatment may have a hydrophilic characteristic and a region not exposed for surface treatment may have an original hydrophobic characteristic.

That is, the surface wettability of the thin films 120 and 130 may be selectively controlled by allowing the thin film 130 of the target pattern of which masking is completed in response to surface treatment of a masked sample and not exposed to the surface treatment to maintain an original hydrophobic characteristic and by allowing the thin film 120 of a region excluding a shape of the target pattern exposed to the surface treatment to have a hydrophilic characteristic. Here, a method of changing the surface wettability, for example, a UV ozone processing method and a plasma processing method, may be used as a surface treatment method.

Referring to (c) of FIG. 2, in operation S150, the thin film 130 of the target pattern may be delaminated by dipping a surface of the thin film 120, 130 with a wettability changed in response to a completion of the selective surface treatment into a liquid material 1 and by applying a crack opening force capable of delaminating an interface between the thin film 130 and the substrate 110.

Here, the liquid material 1 may generally use water, and patterning and transfer may be performed using the liquid material 1 alone without using etchant. Also, a pattern using various thin film materials having various thicknesses may be transferred by controlling the surface tension of the liquid material 1 through addition of surfactant or use of another liquid material 1. Here, the material that reduces the surface tension may be surfactant including sodium dodecylbenzenesulfonate (SDBS), sodium laureth sulfate (SLES), and the like. On the contrary, a material that increases the surface tension may include sodium chloride (NaCl), sodium lithium (LiCl), and the like.

In detail, in the case of the thin film 130 of the target pattern having the hydrophobic characteristic, delamination may proceed in response to applying of a sufficient crack opening force capable of delaminating the interface between the thin film 130 of the target pattern and the substrate 110 by the liquid material 1. Also, in the case of the thin film 120 of the region excluding the shape of the target pattern having the hydrophilic characteristic, delamination may not proceed in response to a change in a formation angle of a meniscus line between the liquid material 1 and the surface of the thin film 120 and a decrease in a crack opening force. Once a crack initiates due to an operation of the sufficient crack opening force, the crack propagation may easily occur due to a water penetration effect. Referring to (d) of FIG. 2, the thin film 120, 130 delaminated in response to a completion of crack propagation may be floating with maintaining an original shape through the surface tension of the liquid material 1.

Meanwhile, the delaminating may include iteratively performing a delamination process of a plurality of thin films to be floating on the surface of the water and assembling the plurality of floating thin films on the surface of the water. Also, the scoop-up transferring may include scoop-up transferring the plurality of thin films that floats and immerses a target substrate 140 into the liquid material 1 and then lifting up the target substrate 140. It is further described with reference to FIGS. 10 and 11.

Referring to (e) of FIG. 2, in operation S160, when masking is performed on the shape of the target pattern, the shape of the target pattern may be floating on the water and the floating thin film 130 may be scooped up after dipping the target substrate 140 that is a transfer target into the water and then slowly lifting up the target substrate 140. That is, when the thin film 130 of the target pattern is floating in the liquid material 1, the thin film 130 of the target pattern floating may be scooped up by immersing the target substrate 140 into the liquid material 1 and then lifting up the target substrate 140 and may be transferred to the target substrate 140 as shown in (f) of FIG. 2.

Here, a substrate having a relatively high bending stiffness may be used for the target substrate 140. A flexible substrate having a relatively low bending stiffness or a substrate having a thin thickness may be used for the target substrate 140 by providing a thick substrate below the corresponding substrate. A material of the target substrate 140 may include glass, polydimethylsiloxane (PDMS), polyethylene terephthalate (PET), polyethylene (PE), polystyrene (PS), parylene, ecoflex, hydrogel, and the like.

Also, an extremely thin material with a desired thickness or less, such as graphene may be unstable for a single layer structure to be floating on the water without a crack and accordingly, may be protected and then transferred using a sacrificial layer. The sacrificial layer may be removed when the transfer process is completed.

A 2D heterostructure in which special patterns in various shapes are stacked may be acquired by iteratively performing a selective transfer process including operation S110 to S160. The 2D heterostructure may have a new functionality unattainable in an existing single layer structure.

Referring to (f) of FIG. 2, a selectively transferred thin film may be formed on the target substrate 140 through the above process. In detail, a thin film to be selectively transferred to the target substrate 140 according to an example embodiment may include the thin film 130 of the target pattern that is delaminated by patterning the thin film 120 deposited on the substrate 110 to acquire the thin film 130 of the target pattern, by masking the thin film 130 of the target pattern, by selectively controlling a surface wettability through surface treatment of the masked thin film 130, by dipping a surface of the thin film 130 with a wettability changed in response to a completion of the selective surface treatment into the liquid material 1, and by applying a crack opening force capable of delaminating an interface between the thin film 130 and the substrate 110; and the target substrate 140 configured to scoop-up transfer the floating thin film 130 of the target pattern by immersing the target substrate 140 into the liquid material 1 and then lifting up the target substrate 140 when the thin film 130 of the target pattern is floating in the liquid material 1.

Figure 3:
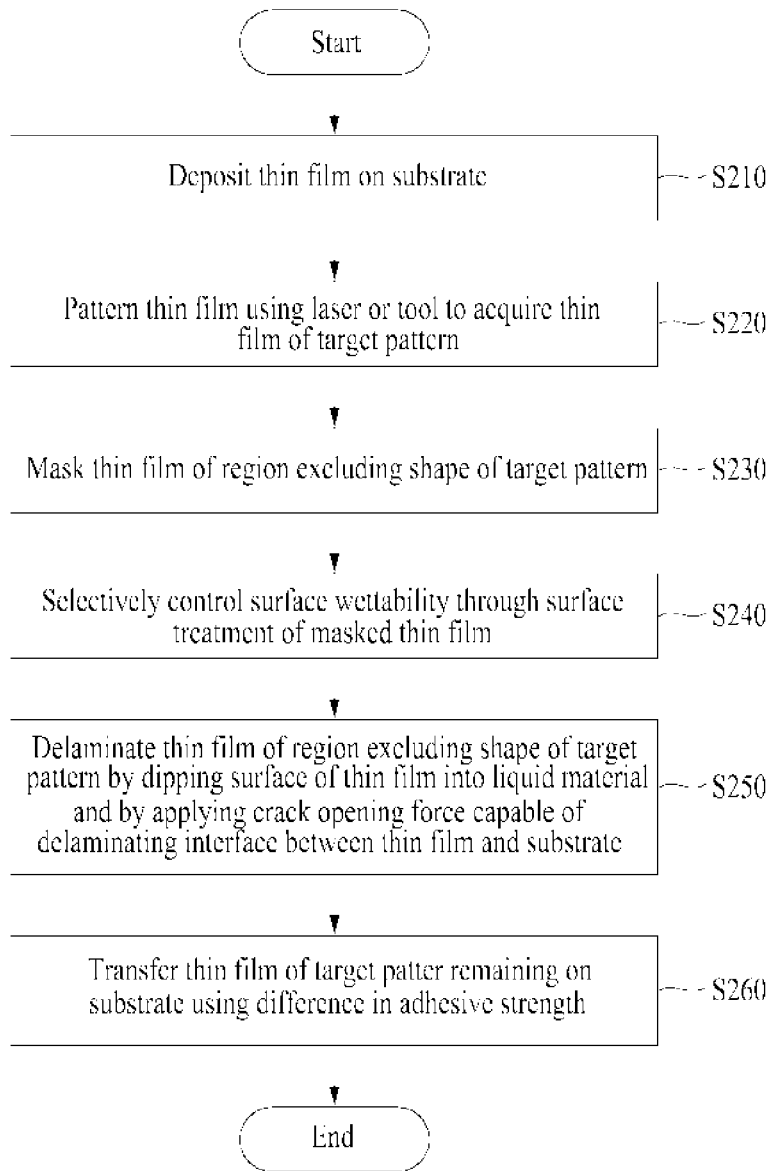
FIG. 3 is a flowchart illustrating another example of a method of selectively delaminating and transferring a thin film using a liquid platform according to an example embodiment.
Figure 4:
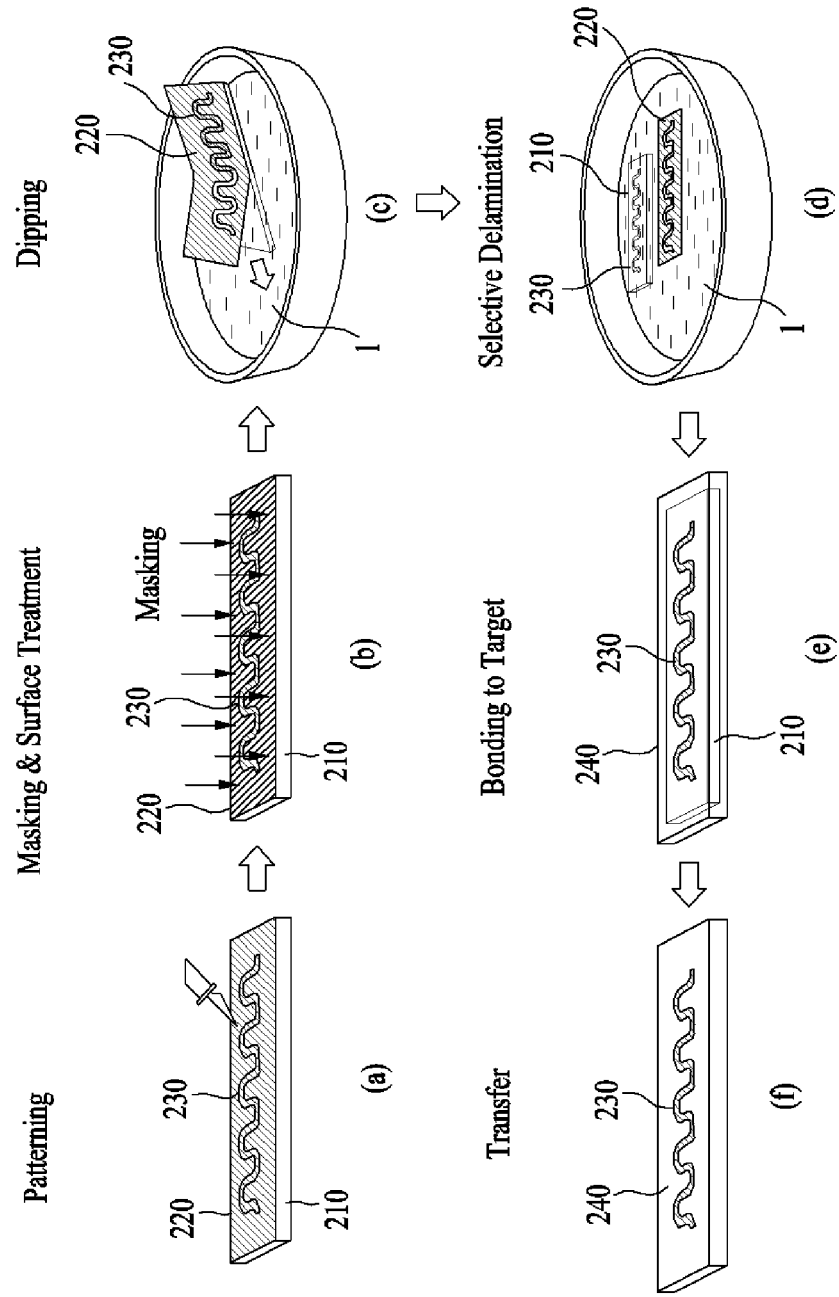
FIG. 4 illustrates another example of describing a method of selectively delaminating and transferring a thin film using a liquid platform according to an example embodiment.

FIG. 3 is a flowchart illustrating another example of a method of selectively delaminating and transferring a thin film using a liquid platform according to an example embodiment, and FIG. 4 illustrates another example of describing a method of selectively delaminating and transferring a thin film using a liquid platform according to an example embodiment.

Referring to FIG. 3, the method of selectively delaminating and transferring a thin film using a liquid platform may include operation S210 of depositing a thin film on a substrate; operation S220 of patterning the thin film using a laser or a tool to acquire a thin film of a target pattern; operation S230 of masking a thin film of a region excluding a shape of the target pattern; operation S240 of selectively controlling a surface wettability through surface treatment of the masked thin film; operation S250 of delaminating the thin film of the region excluding the shape of the target pattern by dipping a surface of the thin film with a wettability changed in response to a completion of the selective surface treatment into a liquid material and by applying a crack opening force capable of delaminating an interface between the thin film and the substrate; and operation S260 of transferring the thin film of the target pattern remaining on the substrate using a difference in an adhesive strength.

Hereinafter, each operation of the method of selectively delaminating and transferring a thin film using a liquid platform will be further described with reference to FIGS. 3 and 4.

In operation S210, a thin film 220 may be deposited on a substrate 210. For example, the thin film 220 may be deposited on the substrate 210 using an existing film deposition method, such as a CVD or a PVD. Here, an Au film and the thin film 220 may be deposited on a silicon wafer or a thermal oxide silicon wafer. However, in general, a quartz wafer, a GaAs wafer, a sapphire wafer, and glass having a relatively high thermal stability and low surface roughness may be used as a material of the substrate 210. Here, various materials including gold, a metal such as copper and nickel, polymer, ceramic, a complex material film, and a two-dimensional material such as graphene may be used as a material of the thin film 220.

Referring to (a) of FIG. 4, in operation S220, patterning may be performed on the thin film 220 using a laser and a tool to acquire a thin film 230 of a target pattern. For example, to acquire the thin film 230 of a desired pattern, a cutting plotter, a laser, a femtosecond laser for a precise process, a CNC machining tool, and the like may be used. Here, the target pattern may be a character, and may be any pattern, for example, a serpentine pattern for an electrode, a pattern for a thin film inductor, and a pattern for a thin film transistor (TFT).

Meanwhile, in the case of processing using the femtosecond laser, a masking and surface treatment process may not be required since a local nano-welding effect may occur due to heat generated from the patterning process using the laser and an adhesive strength between the substrate 210 and the thin film material may be enhanced. Therefore, a selective delamination may be performed without controlling the surface wettability using the surface treatment process.

Referring to (b) of FIG. 4, in operation S230, masking may be performed on the thin film 220 of the region excluding the shape of the target pattern. Here, the thin film 220 of the region excluding the shape of the target pattern may be masked using a material capable of preventing a surface treatment effect as a masking material. For example, a polyimide (PI) film and photoresist may be used.

In operation S240, once masking is completed, a surface wettability may be selectively controlled by performing a surface treatment on the thin film 220, 230. That is, the surface wettability may be selectively controlled by allowing the thin film 220 of the region excluding the shape of the target pattern of which masking is completed in response to surface treatment of a masked sample and not exposed to the surface treatment to maintain an original hydrophobic characteristic and by allowing the thin film 230 of the target pattern exposed to the surface treatment to have a hydrophilic characteristic. Here, a method of changing the surface wettability, for example, a UV ozone processing method and a plasma processing method, may be used as a surface treatment method.

Referring to (c) of FIG. 4, in operation S250, the thin film 220 of the region excluding the shape of the target pattern may be delaminated by dipping a surface of the thin film 220, 230 with a wettability changed in response to a completion of the selective surface treatment into a liquid material 1 and by applying a crack opening force capable of delaminating an interface between the thin film 220 and the substrate 210.

In detail, in the case of the thin film 220 of the region excluding the shape of the target pattern having the hydrophobic characteristic, delamination may proceed in response to applying of a sufficient crack opening force capable of delaminating the interface between the thin film 220 of the region excluding the shape of the target pattern and the substrate 210 by the liquid material 1. Also, in the case of the thin film 230 of the shape of the target pattern having the hydrophilic characteristic, delamination may not proceed in response to a change in a formation angle of a meniscus line between the liquid material 1 and the surface of the thin film 230 and a decrease in a crack opening force. Here, referring to (d) of FIG. 4, when masking is performed on the thin film 220 of the region excluding the shape of the target pattern, the thin film 220 of the region excluding the shape of the target pattern may be floating in the water.

Referring to (e) and (f) of FIG. 4, in operation S260, the thin film 230 of the target pattern remaining on the substrate 210 using a difference in an adhesive strength may be transferred to the target substrate 240.

In detail, when masking is performed on a portion excluding the shape of the target pattern, a pattern shape may remain on the substrate 210. Therefore, a thin film of a specific pattern remaining on the substrate 210 may be transferred onto the target substrate 240 using the difference in the adhesive strength. Here, a material of the target substrate 240 may include glass, polydimethylsiloxane (PDMS), polyethylene terephthalate (PET), polyethylene (PE), polystyrene (PS), parylene, ecoflex, hydrogel, and the like, which is similar to the aforementioned example. The thin film 230 of the target pattern may be transferred to the substrate 240 by using a van der Waals force between the thin film 230 of the target pattern and the target substrate 240 or by increasing an adhesive strength between the thin film 230 of the target pattern and the target substrate 240 by applying adhesives. Also, the thin film 230 of the target pattern may be transferred to the target substrate 240 by controlling the adhesive strength through hot pressing or a surface activation method using additional surface treatment.

Meanwhile, a shape of a crack may be controlled and a selective delamination may be performed based on applying force of cracking or intensity of a laser beam. In the example embodiment, a crack initiation may vary based on a shape of a crack of a gold-silicon wafer interface in addition to a surface wettability and surface tension of liquid. A crack formed along the cleaving surface of a silicon wafer has a sharp front tip. Therefore, a higher stress may occur due to the surface tension of the liquid material 1 and a crack may be initiated. On the contrary, in the case of applying a patterning method to prevent the crack tip from being sharp, the crack initiation may be prevented from occurring.

As described above, a 2D heterostructure in which special patterns in various shapes are stacked may be acquired by iteratively performing a selective transfer process including operation S210 to S260. The 2D heterostructure may have a new functionality unattainable in an existing single layer structure.

Referring to (f) of FIG. 4, a selectively transferred thin film may be formed on the target substrate 240 through the above process. In detail, a thin film to be selectively transferred to the target substrate 240 according to an example embodiment may include the thin film 230 of the target pattern that remains on the substrate 210 by patterning the thin film 220 deposited on the substrate 210 using a laser or a tool to acquire the thin film 230 of the target pattern, by masking the thin film 220 of the region excluding the shape of the target pattern, by selectively controlling a surface wettability through surface treatment of the masked thin film 220, and by delaminating the thin film 220 of the region excluding the shape of the target pattern by dipping a surface of the thin film 220 with a wettability changed in response to a completion of the selective surface treatment into the liquid material 1 and by applying a crack opening force capable of delaminating an interface between the thin film 220 and the substrate 210; and the target substrate 240 configured to transfer the thin film 230 of the target pattern remaining on the substrate 210 using a difference in an adhesion strength.

Figure 5A:
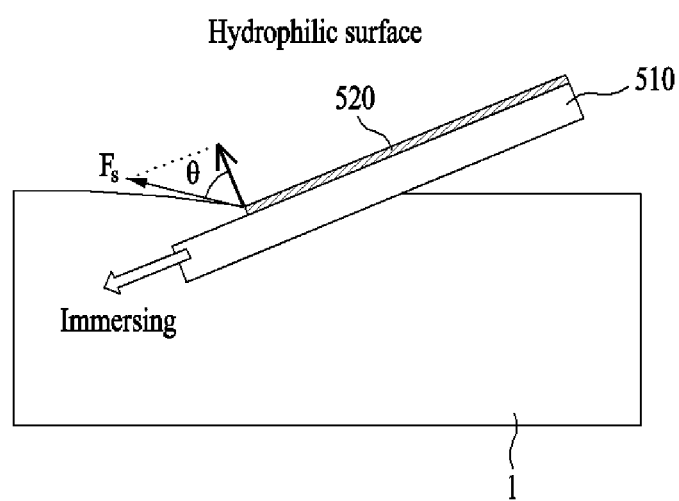
FIG. 5A illustrate examples of describing a method of selectively delaminating a thin film in the case of a hydrophilic surface according to an example embodiment.

FIG. 5A illustrate examples of describing a method of selectively delaminating a thin film in the case of a hydrophilic surface according to an example embodiment. Also, FIG. 5B illustrate examples of describing a method of selectively delaminating a thin film in the case of a hydrophobic surface according to an example embodiment.

Figure 5B:
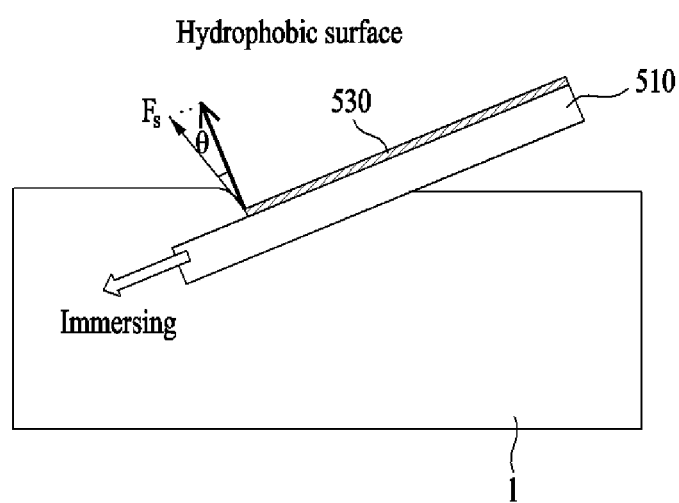
FIG. 5B illustrate examples of describing a method of selectively delaminating a thin film in the case of a hydrophobic surface according to an example embodiment.

Referring to FIGS. 5A and 5B, if a surface of which a surface wettability is changed in response to a completion of selective surface treatment is gently immersed into a liquid platform, a crack opening force may act in a thin film due to a surface tension of a liquid material 1.

Referring to FIG. 5A, in the case of a hydrophilic surface 520 acquired by performing surface treatment on a thin film deposited on a substrate 510, a formation angle of a meniscus line between the liquid material 1 and the surface of the thin film may vary and accordingly, a relatively small crack opening force may act and a delamination may not proceed.

On the contrary, referring to FIG. 5B, a sufficient crack opening force capable of delaminating an interface between the thin film and the substrate 510 may be applied to a hydrophobic surface 530 deposited on the substrate 510 and a delamination may proceed. Once a crack initiates due to an operation of the sufficient crack opening force, a crack may easily progress due to a water penetration effect.

Such a change in the surface wettability may cause a change in the meniscus line between the liquid material 1 and the thin film 520, which may result in causing a change in the crack opening force by a surface tension.

Figure 6:
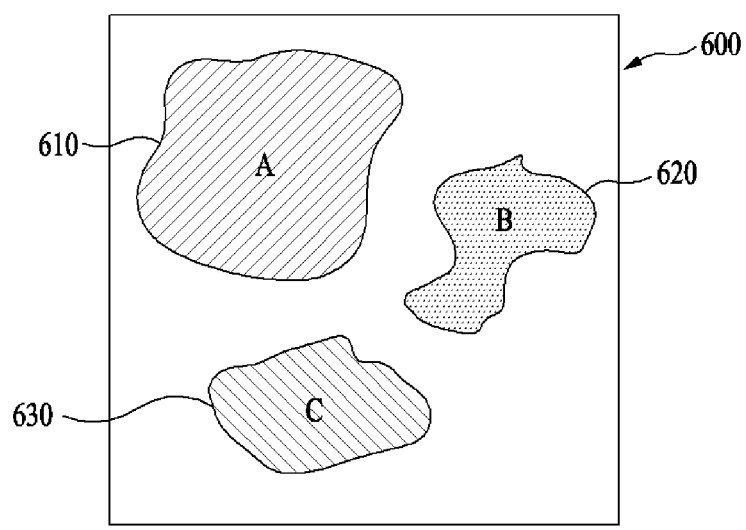
FIG. 6 illustrates an example of describing a selective surface treatment on a plurality of thin film regions according to an example embodiment.

FIG. 6 illustrates an example of describing a selective surface treatment on a plurality of thin film regions according to an example embodiment.

Referring to FIG. 6, a thin film of a desired pattern or a thin film of a desired region may be selectively delaminated and then transferred using a liquid platform. A plurality of thin film regions may be formed on a thin film 600 deposited on a substrate. For example, the plurality of thin film regions may include a region A 610, a region B 620, and a region C 630. Here, through selective surface treatment, only a thin film of a region, for example, the region B 620, desired to be transferred may be floating on a liquid material, for example, in the water and a thin film of a remaining region may remain on the substrate. Here, the region B 620 to be transferred may be masked and may not be exposed to the surface treatment and may have an original hydrophobic characteristic. The thin film 600 including the region A 610 and the region C 630 excluding a shape of a target pattern, exposed to the surface treatment, may have a hydrophilic characteristic. In this manner, a surface wettability of the thin film 600 may be selectively controlled.

Also, through selective surface treatment, only a thin film of a region, for example, the region B 620, desired to be transferred may remain on the substrate and a remaining region may be floating on the liquid material, for example, in the water. The thin film of the region B 620 remaining on the substrate may be transferred to a target substrate using a difference in an adhesive strength.

Figure 7:
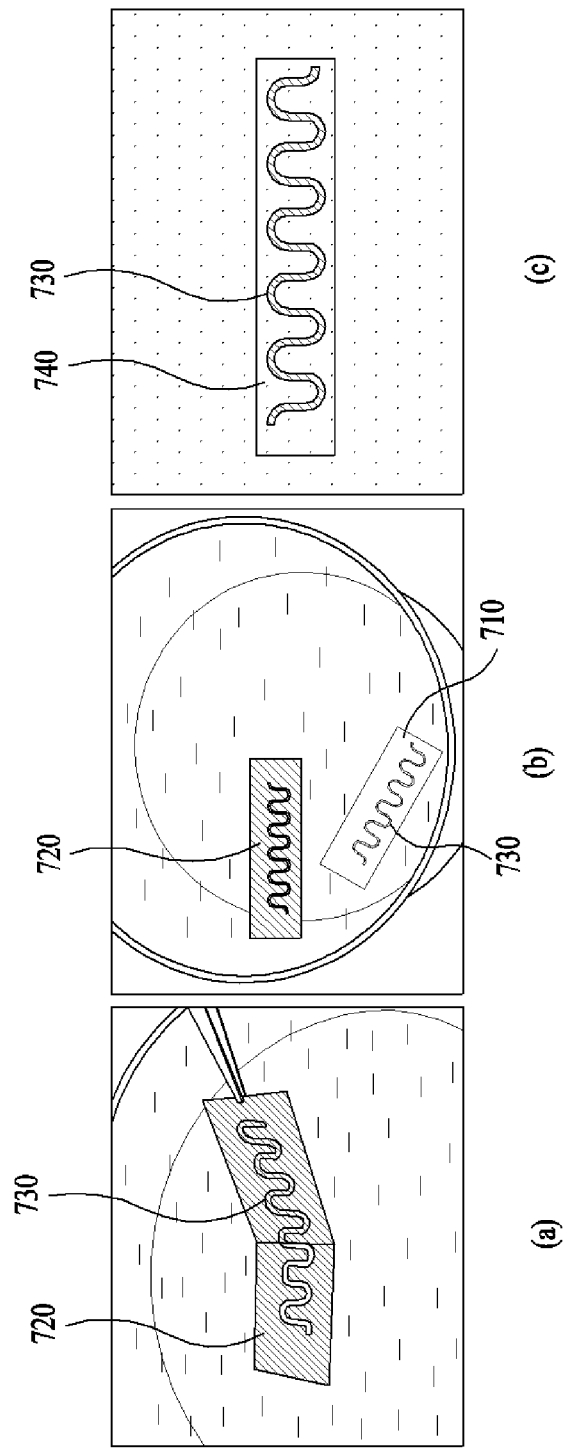
FIG. 7, (a), (b), and (c), illustrate examples of manufacturing an electrode of a serpentine pattern according to an example embodiment.

FIG. 7, (a), (b), and (c), illustrate examples of manufacturing an electrode of a serpentine pattern according to an example embodiment. FIG. 7 illustrates an example of manufacturing an electrode of a serpentine pattern for development of a wearable and stretchable electronic device. For example, an Au thin film 720, 730 with a thickness of 100 nm may be delaminated in a specific pattern 730 from SiO2 wafer 710 and may be transferred to PDMS 740.

Figure 8:
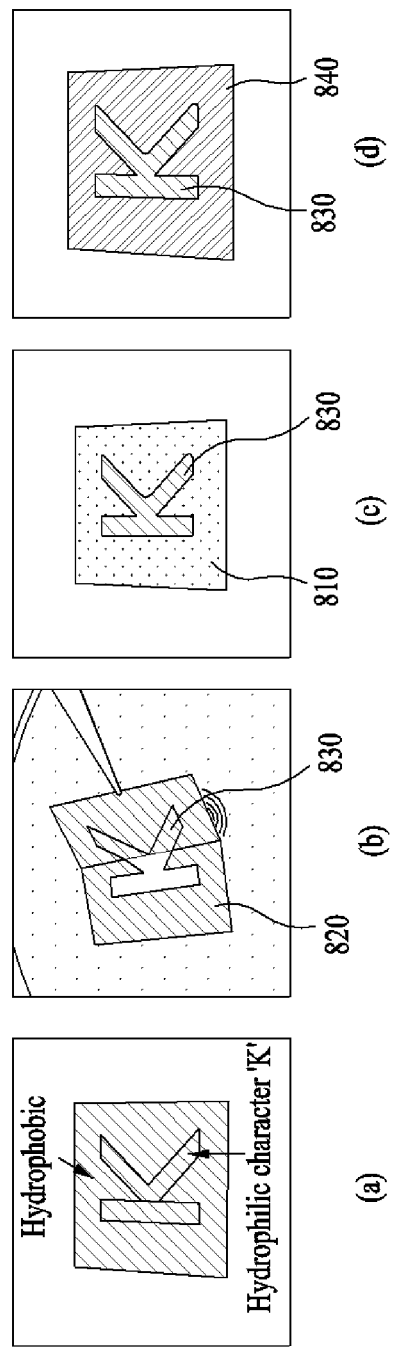
FIG. 8, (a), (b), (c), and (d), illustrate examples of manufacturing a thin film in a character pattern according to an example embodiment.

FIG. 8, (a), (b), (c), and (d), illustrate examples of manufacturing a thin film in a character pattern according to an example embodiment. Referring to FIG. 8, to manufacture a thin film 820, 830 of a character pattern 830, an Au thin film may be selectively delaminated from Si wafer 810 and transferred to be on a PET substrate 840.

Figure 9:
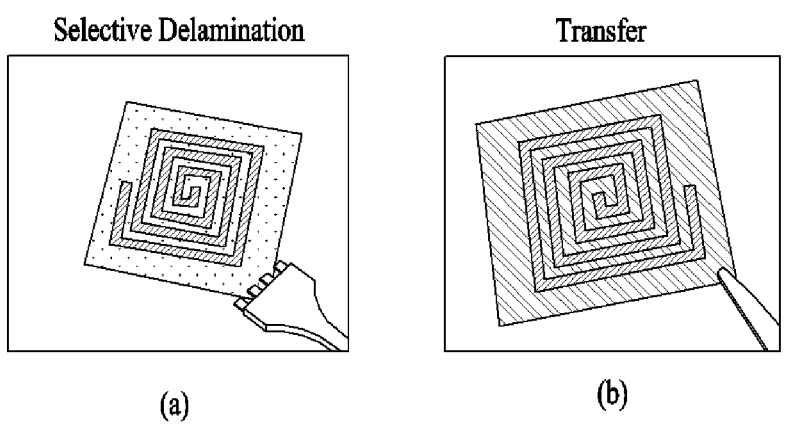
FIG. 9, (a) and (b), illustrate examples of manufacturing a thin film spiral inductor according to an example embodiment.

FIG. 9, (a) and (b), illustrate examples of manufacturing a thin film spiral inductor according to an example embodiment. Referring to FIG. 9, to manufacture a thin film spiral inductor, an Au thin film may be selectively delaminated from Si wafer and may be transferred to be on a PET substrate.

In the case of transferring a patterned thin film using the aforementioned method of patterning and selectively transferring a thin film using a liquid platform, it is possible to achieve a patterning process having a resolution beyond limitations found in existing processes. That is, a pattern size or a line width may be widely controllable ranging from a nanometer scale to a centimeter scale.

Since an etching process is not required and light is not directly exposed to a substrate, the aforementioned technology may readily apply to biotechnology and be eco-friendly. The use of etchant may cause chemical damage to a thin film and a substrate and may also cause a chemical waste generation issue and accordingly, may be avoided. According to example embodiments, patterning and transfer may be performed using only a liquid material, generally, for example, water, without using etchant. Therefore, it is possible to provide technology very suitable for the current trend, avoiding from chemical damage and environmental issues.

Also, by sophisticatedly controlling an adhesive strength between the thin film and the substrate and a surface tension of the liquid material, patterning and selective delamination may be performed on the thin film ranging from tens of nanometers to a few micrometers and an extremely thin two-dimensional material, such as, for example, graphene and MoS2. Due to these features, the present disclosure may apply in various fields, for example, a display, a wearable sensor, an RFID-based wireless communication device, and an energy storage device.

A thin film patterning and transfer method according to example embodiments may use a relatively thin film as well as a thin flexible substrate and may not additionally require adhesives. Therefore, an ultra slim flexible device may be manufactured. Using this, the bending performance of the flexible device may be improved. Also, the use of the ultra slim thin film may reduce the skin effect of an RF communication apparatus, thereby minimizing a transmission loss.

Also, since an unintended crack is prevented from being formed on the thin film during the thin film patterning and transfer process, the mechanical reliability of a manufactured product may be secured.

Also, the thin film patterning and transfer method according to example embodiments may not require a large amount of time and cost in building equipment and performing technology. Accordingly, a highly efficient patterning and transfer process may be performed at a low cost.

Technology according to example embodiments may be performed in an unsealed nonvacuum atmospheric environment. That is, it is possible to perform a fast process configuration and to easily employ the technology in a laboratory scale. Also, a simple display device, optical device, and micro electronic device, and the like may be easily manufactured using the aforementioned method.

Figure 10:
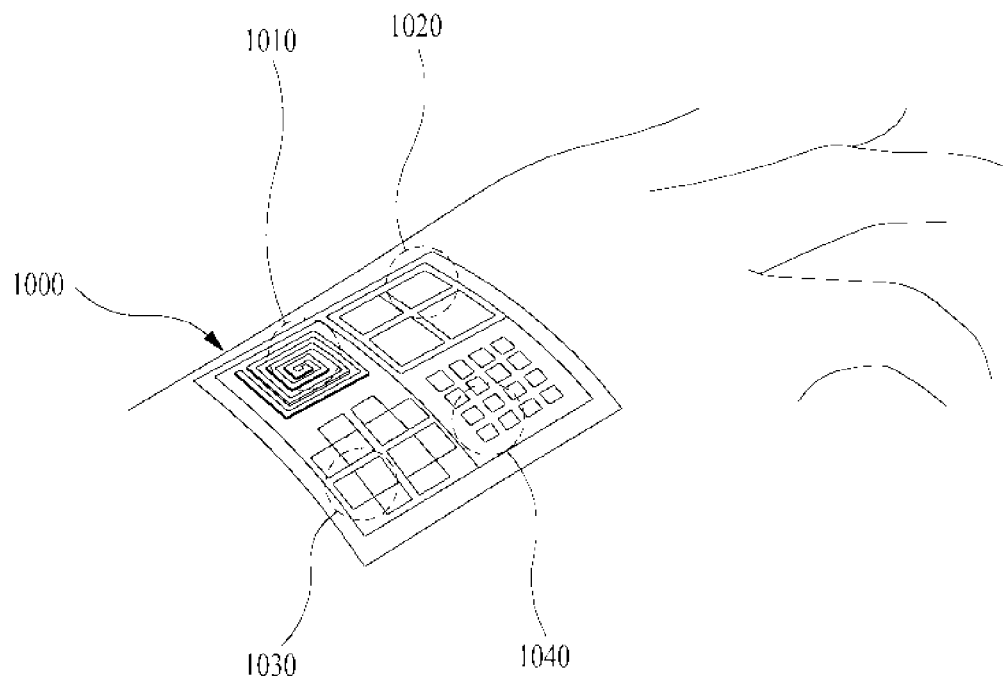
FIG. 10 illustrates an example of a method of assembling a nanofilm device according to an example embodiment.

FIG. 10 illustrates an example of a method of assembling a nanofilm device according to an example embodiment.

Assembly technology of a nanofilm device using a selective delamination (lift-off) process according to an example embodiment is described with reference to FIG. 10. To manufacture a next generation product, for example, a wearable device and a biomedical device, various components, such as a sensor, a battery, a wireless communication device, may be integrated into a single platform. For example, referring to FIG. 10, a nanofilm device 1000 may include an inorganic hybrid photoelectric material 1010, an electrospinning nanofiber-based hybrid material 1020, an electrospinning oxide/metal nanofiber material 1030, and a wearable bio pressure sensor platform 1040. Here, for example, the inorganic hybrid photoelectric material 1010 may be an inorganic hybrid photoelectric material for a wearable solar cell, the electrospinning nanofiber-based hybrid material 1020 may be a nanofiber hybrid material for a wearable secondary cell, the electrospinning oxide/metal nanofiber material 1030 may be a nanofiber material for a wearable gas sensor, and the wearable bio pressure sensor platform 1040 may be a transistor material for a wearable bio pressure sensor.

The high surface tension of the water enables a very thin film to maintain to be in a shape of a very thin thickness in a free-standing state and low viscosity of the water enables a nanofilm to slide without a friction. Through a method of selectively delaminating and transferring a thin film according to an example embodiment, nanofilm devices may be easily assembled using a water platform. That is, various devices may be floating on the water surface and assembled on the water and then transferred to a target substrate. If deposition and transfer conditions, for example, temperature, of thin films differs, it may be difficult to integrate a plurality of parts on a single substrate. However, this issue may be overcome using assembly technology performed on the water surface.

Figure 11:
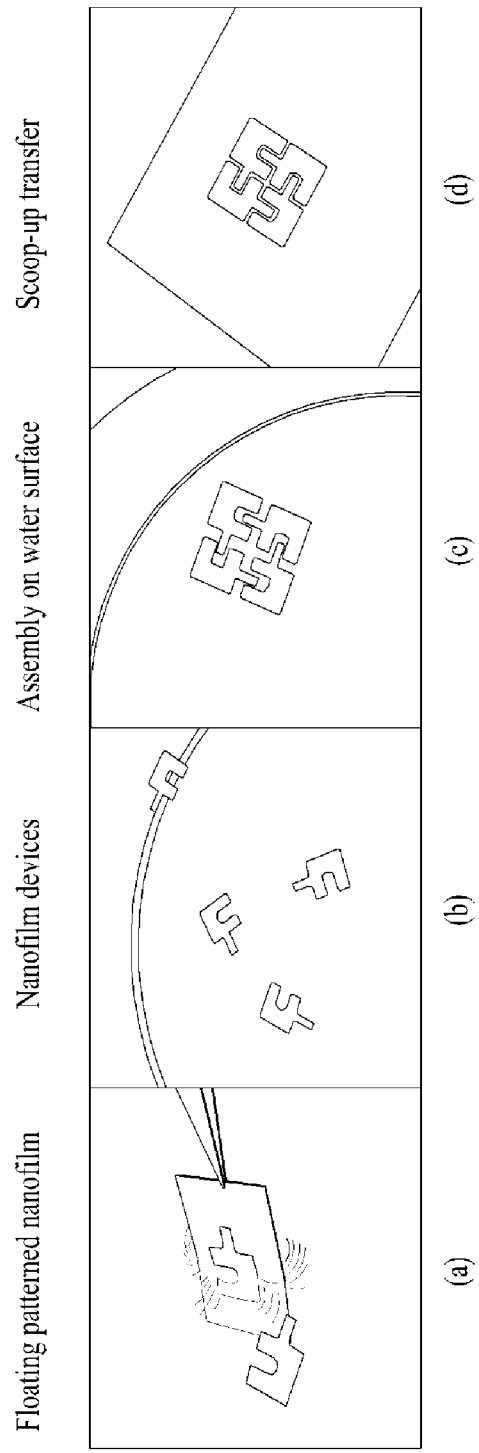
FIG. 11, (a), (b), (c), and (d), illustrate examples of a method of assembling a nanofilm device according to an example embodiment.

FIG. 11, (a), (b), (c), and (d), illustrate examples of a method of assembling a nanofilm device according to an example embodiment.

Referring to FIG. 11, the method of selectively delaminating and transferring a thin film according to an example embodiment may float and assemble Au nanofilm patterns (devices) on the water surface and then transfer the Au nanofilm patterns on a glass substrate. Here, a scoop-up method may be used for transferring the Au nanofilm patterns on the glass substrate.

Also, the method of selectively delaminating and transferring a thin film according to an example embodiment may assemble nanofilm devices based on a unique characteristic of the water surface. Water may be used as an ideal platform to reduce adhesion energy of an interface between a thin film and a substrate and to control a nanofilm.

Referring to (a) of FIG. 11, the method of selectively delaminating and transferring a thin film according to an example embodiment may float a patterned Au nanofilm device having a hydrophobic characteristic on the water surface by selectively masking a patterned device and by exposing a sample to UV/ozone processing. Referring to (b) of FIG. 11, a plurality of Au nanofilm devices may be floating on the water surface by iteratively performing a delamination process. Here, the water having low viscosity enables the nanofilm device to be easily controlled and slide without a friction. Referring to (c) of FIG. 11, the nanofilm devices may be assembled on the water surface using an ultra slim needle. Referring to (d) of FIG. 11, the assembled system may be transferred to the glass substrate using a scoop-up method.

As described above, nanofilm devices (patterns) in various shapes and colors may be assembled through floating on the water surface and then be transferred on the substrate.

The following Table 1 shows a result of comparing an existing method of selectively delaminating and transferring a thin film and a method of selectively delaminating and transferring a thin film according to example embodiments.

TABLE 1

| Thin film patterning method | Resolution issue | Film thickness & Material | Etching process | Cost | Non-planar & flexible substrate | Compatibility with conventional process |
|---|---|---|---|---|---|---|
| Photolithography | <100 nm Optical diffraction | Limited | ○ | Expensive | X | High compatibility |
| Soft lithography | <20 nm Stamp deformation | Unlimited | Partial required | Cheep | ○ | Improvemnt required |

TABLE 1-continued

| Thin film patterning method | Resolution issue | Film thickness & Material | Etching process | Cost | Non-planar & flexible substrate | Compatibility with conventional process |
|---|---|---|---|---|---|---|
| Ink-jet printing | <μm Ink based process | Limited | X | Moderate | ○ | Moderate compatibility |
| Our method | High resolution | Unlimited | X | Cheep | ○ | Improvemnt required |

According to example embodiments, a pattern size or a line width may be widely controllable ranging from a nanometer scale to a centimeter scale. Existing photolithography has reached technical limitations in configuring a resolution of 100 nm or less due to an optical diffraction. Due to unexpected deformation of an elastomeric stamp, for example lateral collapse and sagging, soft lithography has an issue in forming a complex pattern and accordingly, has a difficult in configuring a resolution of 20 nm or less and transferring a large-scale thin film without causing a crack. Also, since an ink-jet printing method is based on a solution-based process, a line width is a level of tens of micrometers and accordingly, a resolution may not be excellent. On the contrary according to an example embodiment, a micro- and nanoscale crack pattern may be formed using a femtosecond layer. Also, although a surface treatment region is not precisely selected, a crack initiation may be designed not to occur. Accordingly, a further excellent resolution may be achieved and a large-scale thin film pattern may be configured without a crack.

The method according to the example embodiment may transfer various thin film patterns using various thicknesses and materials by controlling an adhesive strength between a thin film and a substrate or by controlling a surface tension of a liquid material using addition of surfactant or use of another liquid material. On the contrary, in the case of photolithography, an etchable thin film material may be patterned. In the case of ink jet printing, a material based on a solution "ink" is required. Accordingly, the use of a thin film material may be limited.

An etching process needs to be avoided in the case of collectively considering an environmental aspect, an application to a biological field, and the quality of a thin film. Here, the existing photolithography requires the etching process in many patterning processes. Also, the soft lithography process needs to use photolithography as a pre-process to acquire a pre-patterned master mold. Therefore, the use of the etching process is partially required. On the contrary, the method according to the example embodiment does not require the etching process during the entire process from the patterning process to the transfer process and thus, is eco-environmental.

Referring to Table 1, the invention according to the example embodiment may perform thin film patterning at the lowest cost among comparison groups. The photolithography method requires a vacuum environment and expensive equipment and also uses a large amount of time for patterning. Compared to the photolithography process, the inkjet printing process may be economical in that it is possible to apply in an atmospheric environment and to minimize an amount of materials used. However, since still high-tech equipment is required, it is not easy to build the process. The soft lithography process may be performed using an elastomeric stamp, however, needs to use photolithography for a process to fabricate a master mold of a specific pattern or may need to manufacture a new master mold for each desired pattern. On the contrary, according to the example embodiment, patterning of a thin film may be completed by applying a crack to the thin film and then performing surface treatment and by immersing the thin film into an easily acquirable liquid material, such as water. Accordingly, it is possible to perform a highly efficient process at low cost and to easily construct equipment.

As one of the limitations found in the photolithography process, it is difficult to directly integrate a patterned thin film on a flexible substrate and to apply to a non-planar and flexible substrate. However, technology according to the example embodiment may easily transfer a patterned thin film with a high quality on a substrate in a desired shape and a flexible substrate.

The photolithography process may be most widely used in the existing display and semiconductor manufacture industry. Accordingly, although an initial process is designed to enhance the compatibility with the photolithography process, there is a need for an alternative capable of replacing the photolithography process due to an optical diffraction and efficiency issue of the photolithography method. Technology according to the example embodiment is at an introductory stage of technology and thus, may not be immediately adopted in the industry due to a compatibility in a process. However, with the gradual technical advancement, such an issue may be outperformed.

As described above, compared to existing thin film patterning methods, the method of patterning and selectively transferring a thin film using a liquid platform according to example embodiments may achieve many advantages in various fields. Based thereon, it is possible to configure an ultra-thin wearable sensor, a flexible transparent display, a micro LED, a biomedical device, and a wireless communication system using the method of patterning and transferring a thin film according to the example embodiments.

For example, in terms of developing a wearable sensor, there is a need to make a wearer feel less irritated since a conformal contact with the skin is formed when a sensor is attached onto the skin. To this end, thicknesses of a substrate and a thin film need to be very thin. In detail, an electrode with a thickness of a few nanometers to hundreds of nanometers needs to be elaborately integrated on a thin substrate with a thickness of about a few micrometers. Also, to secure the mechanical reliability of an electrode, a thin film of a specific pattern, for example, a serpentine shape according to an example embodiment needs to be transferred. For commercialization of a wearable sensor, challenging issues are present in various fields. Using the method according to the example embodiments, a patterned thin film with a thin thickness may be integrated on a flexible substrate having a very small bending stiffness.

A most important key factor for a flexible transparent display and semiconductor device may be a thin film transistor (TFT). Many famous display companies use the photolithography process to manufacture the TFT. However, due to the use of a flexible substrate and a thin substrate for development of a flexible or rollable display and an occurrence of optical diffraction, limitations of the photolithography process are becoming an issue. Using a high resolution, a low-cost high-efficient process, and applicability to a flexible substrate and a curved substrate of the method according to the example embodiments under the above situation, the method may replace the existing photolithography process even in the display industry.

Also, the micro LED is a high-tech display technique that is excellent in terms of a response time and efficiency compared to existing liquid crystal display (LCD) technology and does not have a lifespan issue, which is different from an existing organic light emitting diodes (OLED). However, a productivity difficulty is very high since LED alignment including individual pixel elements needs to be elaborately transferred on a flexible substrate. For commercialization of the micro LED, domestic and overseas famous companies are conducting a research and development. However, there still is a difficulty of a transfer process. The thin film patterning and transfer process according to the example embodiment may achieve a high resolution and applicability to a flexible substrate and thus, may be used for the elaborate production operation of the micro LED. Also, a production process completely different from the existing photolithography method may apply to the micro LED production process and thus, there is no need to consider compatibility with an existing process.

The example embodiments may be used for development of a surgical medical device and a health care system to secure information about a health state such as body temperature, heartbeat, and blood sugar. For example, the use of a micro catheter for existing blood vessel disease operation requires the skillfulness of a doctor in a manual operation manner. As enhancement thereof, a wirelessly controllable catheter may be developed by integrating a patterned electrode and a thin film inductor for wireless communication to the micro catheter. Also, blood sugar may be known in real time by integrating a sensor using a very thin electrode into a contact lens worn by a user. In addition, it is possible to develop a biomedical device attachable to blood vessel or a human body such as hair and brain.

Also, an RFID-based wireless communication system requires a thin film inductor. To manufacture an inductor using a thin film, a complex pattern needs to be elaborately formed and transferred. Here, using the method according to the example embodiments, it is possible to easily manufacture an inductor pattern using an ultra-thin film and to integrate the same into a substrate in a random shape. In addition, a loss may occur in an RF region, for example, an ultra high frequency region due to the skin effect. Here, if an extremely thin film is integrated in the RF region, it is possible to significantly reduce a transmission loss by the skin effect. Accordingly, the example embodiments may be very suitable for development of a low loss wireless communication system.

In addition to the aforementioned application examples, the method of patterning and selectively transferring a thin film using a liquid platform according to the example embodiments may apply in various fields and may be used through a simple process and accordingly, may have a relatively high applicability and development probability in a new market as well as an existing market.

While this disclosure includes specific example embodiments, it will be apparent to one of ordinary skill in the art that various alterations and modifications in form and details may be made in these example embodiments without departing from the spirit and scope of the claims and their equivalents. For example, suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A selective transfer method comprising:
depositing a thin film on a substrate;
patterning the thin film using a laser, a cutting plotter, or a computerized numerically controlled machining tool to acquire a thin film of a target pattern;
masking the thin film of the target pattern;
selectively controlling a surface wettability through surface treatment of the masked thin film;
delaminating the thin film of the target pattern by dipping into a liquid material a surface of the thin film with the wettability changed in response to completion of the selective surface treatment, and by applying a crack opening force capable of delaminating an interface between the thin film and the substrate, to provide a floating thin film of the target pattern floating in the liquid material; and
immersing a target substrate into the liquid material when the thin film of the target pattern is floating in the liquid material and then scoop-up transferring the floating thin film of the target pattern.

2. The method of claim 1, wherein the masking comprises masking the thin film of the target pattern using a material capable of preventing a surface treatment effect.

3. The method of claim 1, wherein the selectively controlling of the surface wettability comprises selectively controlling the surface wettability of the thin film by allowing the thin film of the target pattern of which masking is completed in response to surface treatment of a masked sample and not exposed to the surface treatment to maintain an original hydrophobic characteristic and by allowing the thin film of a region excluding a shape of the target pattern exposed to the surface treatment to have a hydrophilic characteristic.

4. The method of claim 1, wherein the delaminating of the thin film of the target pattern comprises proceeding with delamination in response to applying of a sufficient crack opening force capable of delaminating the interface between the thin film of the target pattern and the substrate by the liquid material in the case of the thin film of the target pattern having a hydrophobic characteristic, and not proceeding with delamination in response to a change in a formation angle of a meniscus line between the liquid material and the surface of the thin film and a decrease in a crack opening force in the case of the thin film of a region excluding a shape of the target pattern having a hydrophilic characteristic.

5. The method of claim 1, wherein the scoop-up transferring of the floating thin film of the target pattern comprises performing a protection and a transfer using a sacrificial layer of poly-methyl methacrylate (PMMA) based on an instability of a single thin film layer to be floating in the water without a crack in the case of a two-dimensional (2D) material with a desired thickness or less, and removing the sacrificial layer after performing a transfer process.

6. The method of claim 1, further comprising:
acquiring a 2D heterostructure in which special patterns in various shapes are stacked by iteratively performing a selective transfer process.

7. The method of claim 1, wherein the delaminating of the thin film of the target pattern comprises:
iteratively performing a delamination process on a plurality of thin films to be floating on the surface of the water; and
assembling the plurality of floating thin films on the surface of the water, and
the scoop-up transferring comprises scoop-up transferring the plurality of thin films that floats and then is assembled by immersing the target substrate into the liquid material and then lifting up the target substrate.

8. A selective transfer method comprising:
depositing a thin film on a substrate;
patterning the thin film using a laser, a cutting plotter, or a computerized numerically controlled machining tool to acquire a thin film of a target pattern;
masking a thin film of a region excluding a shape of the target pattern;
selectively controlling a surface wettability through surface treatment of the masked thin film;
delaminating the thin film of the region excluding the shape of the target pattern by dipping into a liquid material a surface of the thin film with the wettability changed in response to completion of the selective surface treatment and by applying a crack opening force capable of delaminating an interface between the thin film and the substrate, to provide a floating thin film of the region excluding the shape of the target pattern floating in the liquid material; and
transferring the thin film of the target pattern remaining on the substrate using a difference in an adhesive strength.

9. The method of claim 8, wherein the masking comprises masking the thin film of the region excluding the shape of the target pattern using a material capable of preventing a surface treatment effect.

10. The method of claim 8, wherein the selectively controlling of the surface wettability comprises selectively controlling the surface wettability of the thin film by allowing the thin film of the region excluding the shape of the target pattern of which masking is completed in response to surface treatment of a masked sample and not exposed to the surface treatment to maintain an original hydrophobic characteristic and by allowing the thin film of the target pattern exposed to the surface treatment to have a hydrophilic characteristic.

11. The method of claim 8, wherein the delaminating of the thin film of the region excluding the shape of the target pattern comprises proceeding with delamination in response to applying of a sufficient crack opening force capable of delaminating the interface between the thin film of the region excluding the shape of the target pattern and the substrate by the liquid material in the case of the thin film of the region excluding the shape of the target pattern having a hydrophobic characteristic, and not proceeding with delamination in response to a change in a formation angle of a meniscus line between the liquid material and the surface of the thin film and a decrease in a crack opening force in the case of the thin film of the target pattern having a hydrophilic characteristic.

12. The method of claim 8, wherein the transferring of the thin film of the target pattern comprises increasing an adhesive strength between the thin film of the target pattern and a target substrate by using a van der Waals force or applying adhesives between the thin film of the target pattern and the target substrate, and transferring the thin film of the target pattern to the target substrate.

13. The method of claim 8, further comprising:
acquiring a two-dimensional (2D) heterostructure in which special patterns in various shapes are stacked by iteratively performing a selective transfer process.

* * * * *